United States Patent
O'Connell et al.

(10) Patent No.: US 10,739,832 B2
(45) Date of Patent: Aug. 11, 2020

(54) AIRFLOW PROJECTION FOR HEAT TRANSFER DEVICE

(71) Applicant: International Business Machines Corporation, Armonk, NY (US)

(72) Inventors: Kevin O'Connell, Rochester, MN (US); Joseph Kuczynski, North Port, FL (US); Phillip Mann, Rochester, MN (US); Timothy Tofil, Rochester, MN (US); Mark Plucinski, Toms River, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/158,663

(22) Filed: Oct. 12, 2018

(65) Prior Publication Data

US 2020/0117251 A1    Apr. 16, 2020

(51) Int. Cl.
| | |
|---|---|
| *G06F 1/20* | (2006.01) |
| *F28D 15/02* | (2006.01) |
| *F28F 3/02* | (2006.01) |
| *F28F 13/06* | (2006.01) |
| *H05K 7/20* | (2006.01) |
| *B33Y 10/00* | (2015.01) |
| *B33Y 80/00* | (2015.01) |

(52) U.S. Cl.
CPC .......... *G06F 1/20* (2013.01); *F28D 15/0275* (2013.01); *F28F 3/02* (2013.01); *F28F 13/06* (2013.01); *H05K 7/20154* (2013.01); *B33Y 10/00* (2014.12); *B33Y 80/00* (2014.12); *F28F 2215/08* (2013.01); *G06F 2200/201* (2013.01)

(58) Field of Classification Search
CPC .. H05K 7/20154; H05K 7/2039–20409; G06F 1/20; G06F 2200/201; F28D 15/0275; F28F 2215/08; B33Y 10/00; B33Y 80/00; H01L 23/40

USPC .............. 361/709–710, 719, 679.52, 679.54; 165/80.2–80.3; 257/718–719, 721–722
See application file for complete search history.

(56) References Cited

U.S. PATENT DOCUMENTS

| | | | |
|---|---|---|---|
| 3,810,509 A * | 5/1974 | Kun ....................... | B21D 22/04 165/148 |
| 4,369,838 A * | 1/1983 | Asanuma ............ | H01L 23/4006 165/185 |

(Continued)

FOREIGN PATENT DOCUMENTS

EP    2299488 A1    3/2011

OTHER PUBLICATIONS

Chang et al., "Heat Transfer Analysis of Plate-fin Heat Sink with Piezoelectric Fan", Universal Journal of Mechanical Engineering 2015 (p. 12) http://www.hrpub.org/download/20150101/UJME3-15103066.pdf.

*Primary Examiner* — Daniel P Wicklund
*Assistant Examiner* — Amir A Jalali
(74) *Attorney, Agent, or Firm* — Patterson + Sheridan, LLP

(57) ABSTRACT

A heat transfer device includes a base and a heat sink coupled to the base. The heat sink includes a fin with a surface for receiving a cooling medium to travel across, thereby defining an upstream end and a downstream end for the fin. An airflow projection is coupled to the surface of the fin, in which the airflow projection includes an upstream end and a downstream end with the downstream end of the airflow projection cantilevered above the surface of the fin.

20 Claims, 4 Drawing Sheets

(56) References Cited

U.S. PATENT DOCUMENTS

| | | | | |
|---|---|---|---|---|
| 4,807,441 A * | 2/1989 | Agee | ..................... | H01L 23/467 257/E23.099 |
| 4,997,036 A * | 3/1991 | Schulze | ................... | F28F 1/24 165/109.1 |
| 5,040,596 A * | 8/1991 | Terasaki | ................ | F28D 9/0062 165/166 |
| 5,415,225 A * | 5/1995 | Randlett | ................... | F28F 1/26 165/133 |
| 5,946,190 A * | 8/1999 | Patel | .................. | H05K 7/20154 165/104.21 |
| 6,173,758 B1 | 1/2001 | Ward et al. | | |
| 6,189,601 B1 * | 2/2001 | Goodman | ........... | F28D 15/0233 165/104.33 |
| 6,666,260 B2 * | 12/2003 | Tantoush | .............. | H01L 23/367 165/104.33 |
| 6,830,098 B1 * | 12/2004 | Todd | .................. | F28D 15/0275 165/104.21 |
| 6,883,591 B2 * | 4/2005 | Lai | ...................... | H01L 23/3672 165/185 |
| 6,913,069 B2 | 7/2005 | Barsun et al. | | |
| 7,584,780 B1 | 9/2009 | Lemont et al. | | |
| 7,911,798 B2 * | 3/2011 | Chang | ................. | H01L 23/3672 257/709 |
| 10,408,542 B2 * | 9/2019 | Heitmann | ............ | F28F 9/0138 |
| 10,415,894 B2 * | 9/2019 | Abrahamian | ....... | F28D 1/05333 |
| 2002/0139515 A1 * | 10/2002 | Azar | ........................ | F28F 3/02 165/80.3 |
| 2003/0189813 A1 * | 10/2003 | Lee | ..................... | H01L 23/3672 361/704 |
| 2003/0213582 A1 * | 11/2003 | Lin | .......................... | F28F 3/02 165/80.3 |
| 2003/0213587 A1 * | 11/2003 | Mano | ...................... | B60K 6/40 165/174 |
| 2004/0011509 A1 * | 1/2004 | Siu | ...................... | F28D 15/0233 165/80.3 |
| 2006/0196640 A1 * | 9/2006 | Siu | ........................ | F28D 15/046 165/104.26 |
| 2007/0107880 A1 | 5/2007 | Hong et al. | | |
| 2007/0193730 A1 | 8/2007 | Ozaki | | |
| 2008/0017350 A1 * | 1/2008 | Hwang | ............... | H01L 23/3672 165/80.3 |
| 2009/0260779 A1 * | 10/2009 | Zhou | ..................... | H01L 23/427 165/80.3 |
| 2010/0157537 A1 * | 6/2010 | Yu | ............................. | F28F 3/02 361/704 |
| 2010/0282444 A1 * | 11/2010 | Lin | ..................... | F28D 15/0275 165/104.26 |
| 2011/0048675 A1 * | 3/2011 | Xu | ....................... | H01L 23/3672 165/80.3 |
| 2012/0103572 A1 * | 5/2012 | Hwang | ............... | F28D 15/0275 165/104.26 |
| 2014/0332182 A1 * | 11/2014 | Taras | ..................... | H01L 23/36 165/80.3 |
| 2014/0367074 A1 * | 12/2014 | Hirasawa | ........... | F28D 15/0275 165/104.26 |
| 2018/0290212 A1 * | 10/2018 | Jaworowski | .............. | C25F 3/22 |
| 2018/0374777 A1 * | 12/2018 | Yu | ....................... | F28D 15/0233 |
| 2019/0249929 A1 * | 8/2019 | Rush | ..................... | F28D 15/046 |

* cited by examiner

US 10,739,832 B2

AIRFLOW PROJECTION FOR HEAT TRANSFER DEVICE

TECHNICAL FIELD

The present disclosure relates to a heat transfer device, and more specifically, to an airflow projection included on a fin of a heat sink.

BACKGROUND

Electronic components, such as central processing units (CPUs), generate heat during normal operation. Unless removed, the heat will adversely affect the operational stability of the electronic component. Measures must therefore be taken to efficiently remove the heat. For example, a heat sink (e.g., a cold plate) may be mounted on the electronic component to remove heat therefrom.

A heat sink generally includes a base for contacting the electronic component and absorbing the heat from the electronic component, and a plurality of fins coupled to the base to dissipate the absorbed heat from the base. Passages are defined between the fins, and airflow may be provided (such as from a fan) through the passages to increase the heat dissipation from the heat sink. The electronic components, and particularly CPUs, are only becoming more powerful and smaller, therefore requiring improved heat sinks to dissipate the increased heat generated over a smaller area. Further, the air passing through the heat sink may deposit dust on the heat sink, thereby decreasing the effectiveness of the heat sink over time.

SUMMARY

According to one embodiment of the present disclosure, a heat transfer device includes a base and a heat sink coupled to the base. The heat sink includes a fin with a surface for receiving a cooling medium to travel across, thereby defining an upstream end and a downstream end for the fin. An airflow projection is coupled to the surface of the fin, in which the airflow projection includes an upstream end and a downstream end with the downstream end of the airflow projection cantilevered above the surface of the fin.

According to another embodiment of the present disclosure, a heat sink includes a fin with a surface for receiving a cooling medium to travel across, thereby defining an upstream end and a downstream end for the fin. An airflow projection is coupled to the surface of the fin, in which the airflow projection includes an upstream end and a downstream end with the downstream end of the airflow projection cantilevered above the surface of the fin.

According to yet another embodiment of the present disclosure, a method of manufacturing a heat transfer device includes forming a fin comprising a surface configured for receiving a cooling medium to travel across, forming an airflow projection on the surface, the airflow projection including an upstream end and a downstream end with the downstream end of the airflow projection cantilevered above the surface of the fin, and coupling the fin to a base.

DETAILED DESCRIPTION

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In embodiments of the present disclosure, a heat transfer device is used to dissipate heat from an electronic component. The heat transfer device includes a base and a heat sink coupled to the base. The heat sink includes one or more fins, in which the fin includes a surface to receive a cooling medium (e.g., air) to travel across the surface. The fin, thus, has an upstream end and a downstream end for the cooling medium to travel across the surface. One or more airflow projections are coupled or formed upon the surface of the fin. The airflow projection includes an upstream end and a downstream end that corresponds to the upstream end and downstream end of the fin. The downstream end of the airflow projection is cantilevered above the surface of the fin. The cantilevered downstream end of the airflow projection may be used to facilitate and increase the transfer of heat from the fin into the flow of the cooling medium. Further, the cantilevered downstream end of the airflow projection may reduce the accumulation of dust on the heat sink, thereby further increasing (or at least reducing the decrease of) the efficiency of the heat transfer device over time.

Figure 1:
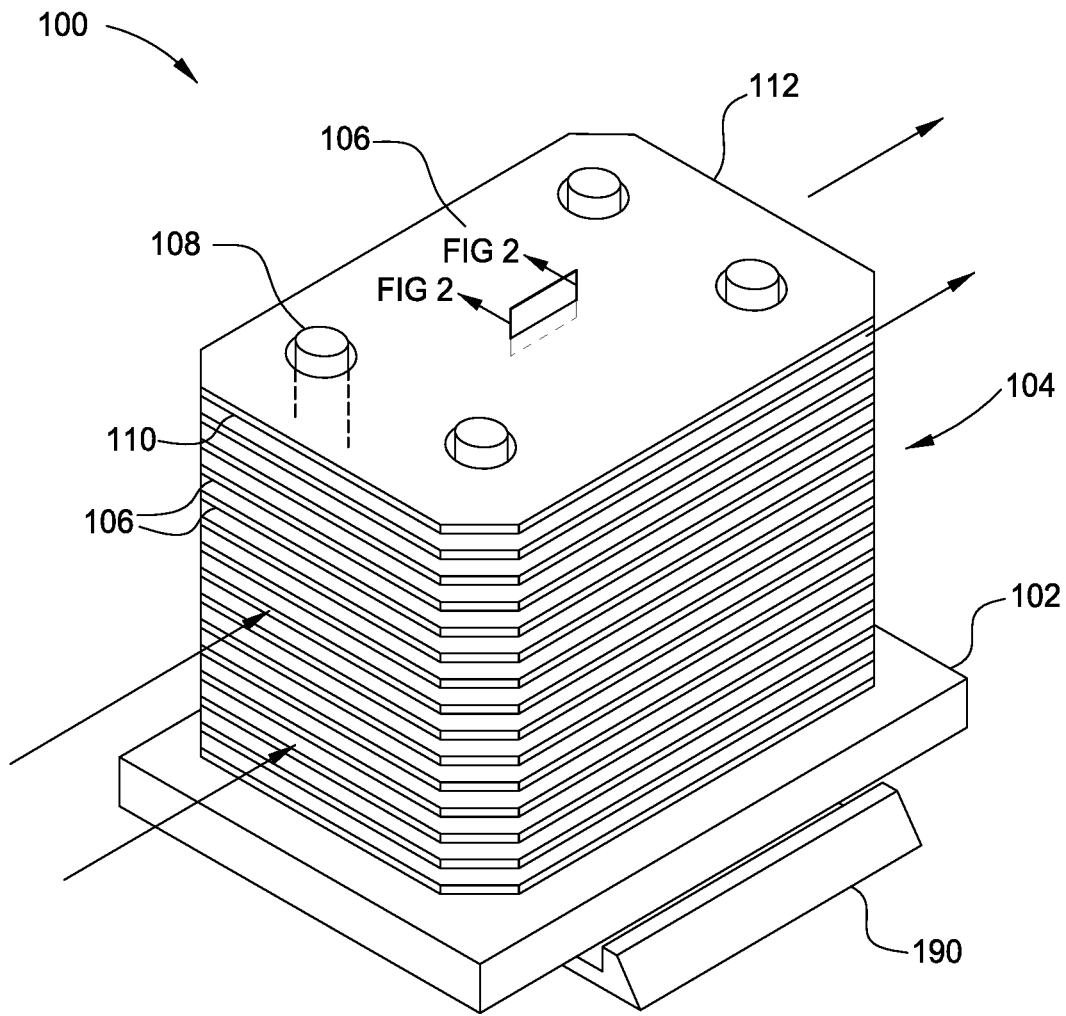
FIG. 1 is an above perspective view of a heat transfer device in accordance with one or more embodiments of the present disclosure.

Referring now to FIG. 1, an above perspective view of a heat transfer device 100 in accordance with one or more embodiments of the present disclosure is shown. The heat transfer device 100 is used to receive and dissipate heat from an electronic component 190. The heat transfer device 100 includes a base 102 and a heat sink 104 coupled to each other with the heat sink 104 including one or more fins 106. The fins 106 of the heat sink 104 in this embodiment are shown as having a horizontal orientation with respect to the base 102. However, the present disclosure is not so limited, as the fins 106 may have any orientation, such as a vertical orientation, with respect to the base 102.

In this embodiment, the heat transfer device 100 may include one or more heat pipes 108 to couple the fins 106 of the heat sink 104 to the base 102. The heat pipes 108 are coupled between the fins 106 and the base 102, such as by having the heat pipes 108 attached to the base 102 and extending through apertures formed within the fins 106. In one embodiment, the components of the heat transfer device 100 may be formed separately from each other and assembled together. For example, the base 102, the fins 106, and/or the heat pipes 108 may each be formed separately from each other and coupled to each other to form the heat transfer device 100. Alternatively, one or more components of the heat transfer device 100 may be formed integrally with each other, such as during manufacturing. In one example, the base 102 and the fins 106 may be formed integrally with each other (e.g., extruded) to couple the fins 106 to the base 102. In such an embodiment, the heat pipes 108 may not be included within the heat transfer device 100.

The heat transfer device 100 is thermally coupled to the electronic component 190 for heat to transfer from electronic component 190 and to the heat transfer device 100. In this embodiment, the base 102 in contact with the electronic component 190 for heat to transfer from the electronic component 190 to the base 102. The heat at the base 102 is transferred to the heat sink 104 for the heat to dissipate through the fins 106. As the heat pipes 108 are included in this embodiment, the heat transfers from the base 102 to the fins 106 through the heat pipes 108. The heat at the fins 106 is then dissipated to the surrounding environment. For example, a cooling medium (e.g., air) is introduced into the heat sink 104, such as by using a fan, and as indicated by the arrows in FIG. 1. The cooling medium travels between and across the surfaces of the fins 106, thereby defining an upstream end 110 and a downstream end 112 for the fins 106. As the cooling medium travels across the surfaces of the fins 106, the heat from the fins 106 transfers to the cooling medium (e.g., airstream) and to the surrounding environment, thereby cooling the heat sink 104.

To further facilitate the transfer of the heat from the electronic component 190 and to the heat transfer device 100, one or more components of the heat transfer device 100 may be formed from or include a thermally conductive material. For example, the components of the heat transfer device 100 may be formed from or include metal, such as aluminum, copper, and/or steel. In one embodiment, the base 102 may be formed from or include aluminum, copper, and/or steel, and one or more of the fins 106 may be formed from or include aluminum or copper. Further, if included within the heat transfer device 100, and one or more of the heat pipes 108 may be formed from or include aluminum or copper.

Figure 2:
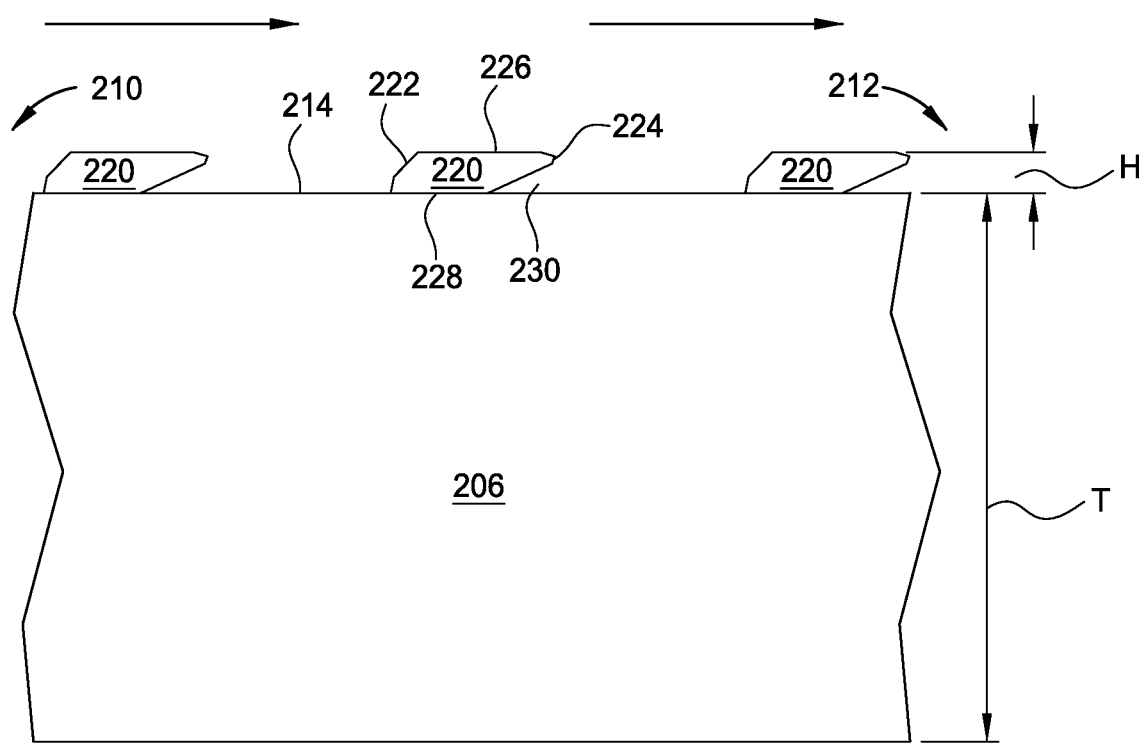
FIG. 2 is a detailed cross-sectional view of a fin of a heat sink that includes airflow projections in accordance with one or more embodiments of the present disclosure.

Referring now to FIG. 2, a detailed cross-sectional view of a fin 206 of a heat sink in accordance with one or more embodiments of the present disclosure is shown. By way of example, FIG. 1 shows a reference to the cross-sectional view FIG. 2 may be taken from with respect to the fins 106. The fin 206 includes a surface 214, such as a substantially flat surface, that receives the cooling medium to travel across. The cooling medium travels in the direction indicated by the arrows in FIG. 2, thereby defining an upstream end 210 and a downstream end 212 for the fin 206.

One or more airflow projections 220 (e.g., denticles) are also included with the fin 206, such as coupled to the surface 214 of the fin 206. The airflow projection 220 includes an upstream end 222 and a downstream end 224 that corresponds to the upstream end 210 and the downstream end 212 of the fin 206. Thus, the upstream end 222 of the airflow projection 220 is closer to the upstream end 210 of the fin 206, and the downstream end 224 of the airflow projection 220 is closer to the downstream end 212 of the fin 206. The airflow projection 220 further includes an upper surface 226 and a lower surface 228, in which the lower surface 228 of the airflow projection 220 is coupled to the surface 214 of the fin 206. The upstream end 222 and the downstream end 224 each extend between the upper surface 226 and the lower surface 228.

As shown, the downstream end 224 of the airflow projection 220 is cantilevered above the surface 214 of the fin 206. For example, the downstream end 224 is positioned and protrudes above the surface 214 of the fin 206 to define a cavity 230 between the downstream end 224 and the surface 214. When viewed from above the airflow projection 220 on the surface 214, the airflow projection 220 has a footprint on the surface 214 that is larger in area than the coupling between the lower surface 228 of the airflow projection 220 and the surface 214 of the fin 206.

Figure 3:
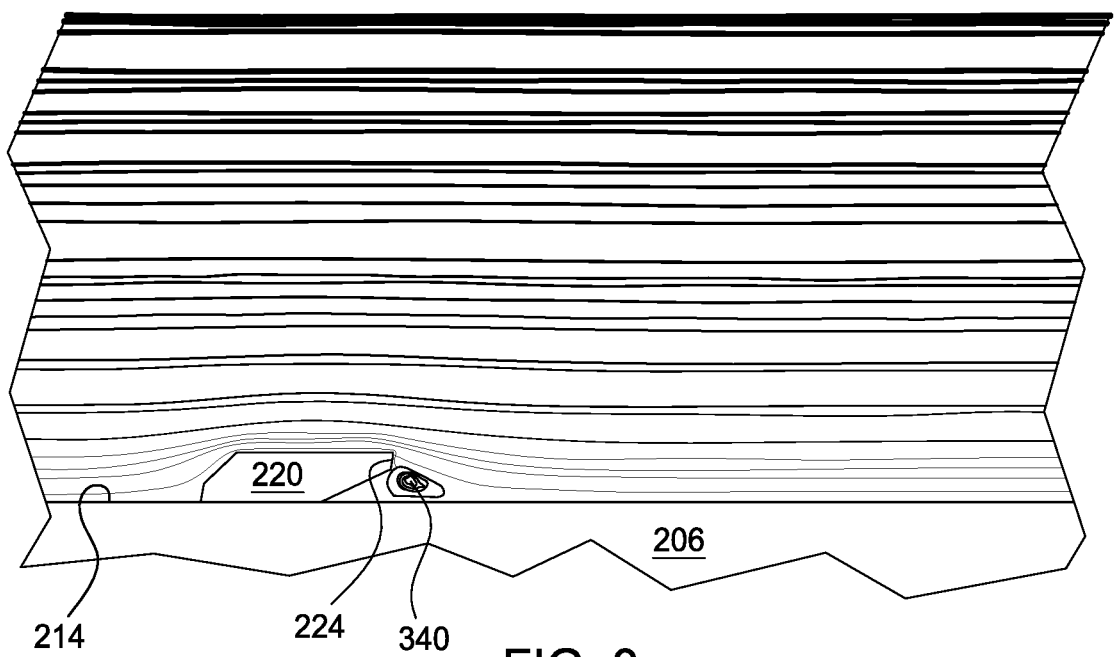
FIG. 3 is a detailed cross-sectional view of a model of a stream of a cooling medium traveling across a fin that includes an airflow projection in accordance with one or more embodiments of the present disclosure.

The cantilevered downstream end 224 for the airflow projection 220 increases the heat transfer between the fin 206 and the stream of the cooling medium. Further, the cantilevered downstream end 224 for the airflow projection 220 may decrease or deter the accumulation of dust or other particulate on the fin 206, further increasing the heat transfer efficiency of the fin 206. For example, FIG. 3 shows an airflow model of the cooling medium flowing across the surface 214 of the fin 206 and the airflow projection 220 in accordance with one or more embodiments of the present disclosure. The cantilevered downstream end 224 for the airflow projection 220 creates an eddy 340 in the stream of the cooling medium adjacent the downstream end 224. The eddy 340 increases the heat transfer between the surface 214 of the fin 206 and the stream of the cooling medium without significantly reducing the overall speed of the stream of the cooling medium. Further, the eddy 340 also decreases or deters the accumulation of dust or other particulate on the fin 206, thereby increasing the heat transfer efficiency of the fin 206 with the stream of the cooling medium.

Referring back to FIG. 2, the airflow projection 220 has a height H, and the fin 206 has a thickness T. The height H of the airflow projection 220 is substantially smaller than the thickness T of the fin 206, as the relative size of the height H of the airflow projection 220 with respect to the thickness T of the fin 206 may be used to control and improve the heat transfer efficiency of the fin 206. In one embodiment, the height H of the airflow projection 220 may be between about 5% and about 20% the thickness T of the fin 206. In another embodiment, the height H of the airflow projection 220 may be about 10% the thickness T of the fin 206.

For example, the fin 206 may have a thickness T between about 0.1 mm and about 0.5 mm, and the airflow projection 220 may have a height H between about 0.01 mm and about 0.05 mm. Thus, if the height H of the airflow projection 220 is about 10% the thickness T of the fin 206, the airflow projection 220 may have a height H of about 0.01 mm if the fin 206 has a thickness T of about 0.1 mm, and the airflow projection 220 may have a height H of about 0.05 mm if the fin 206 has a thickness T of about 0.5 mm. The fin 206 also has a width (e.g., the dimension of the fin 206 that extends into the page in FIG. 2) and a length that extends between the upstream end 210 and the downstream end 212. In one or more embodiments, the fin 206 may have a width between about 5 mm and about 200 mm, and may have a length between about 10 mm and about 80 mm. However, the present disclosure is not so limited, as other relative dimensions, sizes, and even shapes, may be used for the fin 206 and/or the airflow projection 220 without departing from the scope of the present disclosure.

As discussed above, one or more airflow projections 220 may be coupled to the surface 214 of the fin 206. In an embodiment in which more than one airflow projection 220 is coupled to the surface 214 of the fin 206, the airflow projections 220 may have different arrangements with respect to each other. In one embodiment, as shown in FIG. 2, the airflow projections 220 may be arranged along the surface 214 from the upstream end 210 and the downstream end 212 of the fin 206. For example, the airflow projections 220 may be arranged substantially parallel to the stream of the cooling medium with respect to each other. In such an embodiment, the stream of the cooling medium passes across one airflow projection 220 at a time. In one or more other embodiments, the airflow projections 220 may be arranged substantially perpendicular or orthogonal to the stream of the cooling medium with respect to each other. Accordingly, one or more different arrangements for the airflow projections are contemplated without departing from the scope of the present disclosure.

The airflow projection 220 is coupled to the surface 214 of the fin 206, such as by being formed on the surface 214. For example, an additive manufacturing process may be used to form the airflow projection 220 on the surface 214. An example of an additive manufacturing process may include three-dimensional printing, selective laser sintering, depositing, and/or soldering the airflow projection 220 on the surface 214. Thus, one or more different processes may be used to couple the airflow projection 220 to the surface 214. The airflow projection 220 may also be formed from or include the same or a different material than the fin 206. For example, the airflow projection 220 may be formed from or include metal, such as aluminum, copper, and/or nickel. In one embodiment, the fin 206 may be formed from or include copper, and the airflow projection 220 may be formed from or include nickel, such as when forming the airflow projection 220 through a selective laser sintering process. However, the airflow projection 220 may be formed from or include non-metal materials, such as graphite, silicon, polymer, and/or plastic. Accordingly, one or more different materials for the airflow projections are contemplated without departing from the scope of the present disclosure.

Referring still to FIG. 2, and as discussed above, the airflow projection 220 includes the upstream end 222 and the downstream end 224 each extending between the upper surface 226 and the lower surface 228. The upstream end 222 and/or the downstream end 224 may include one or more contours or slopes. For example, the upstream end 222 may be tapered, as shown, to facilitate the stream of the cooling medium over the airflow projection 220. As the downstream end 224 is cantilevered over the surface 214, the downstream end 224 may also be tapered. The upstream end 222 and/or the downstream end 224 may be gradually tapered, as shown in FIG. 2. Alternatively, the taper may vary, in that the upstream end 222 and/or the downstream end 224 may have a concave or convex shape or surface. Accordingly, one or more different contours or slopes for the ends of the airflow projections are contemplated without departing from the scope of the present disclosure.

Figure 4:
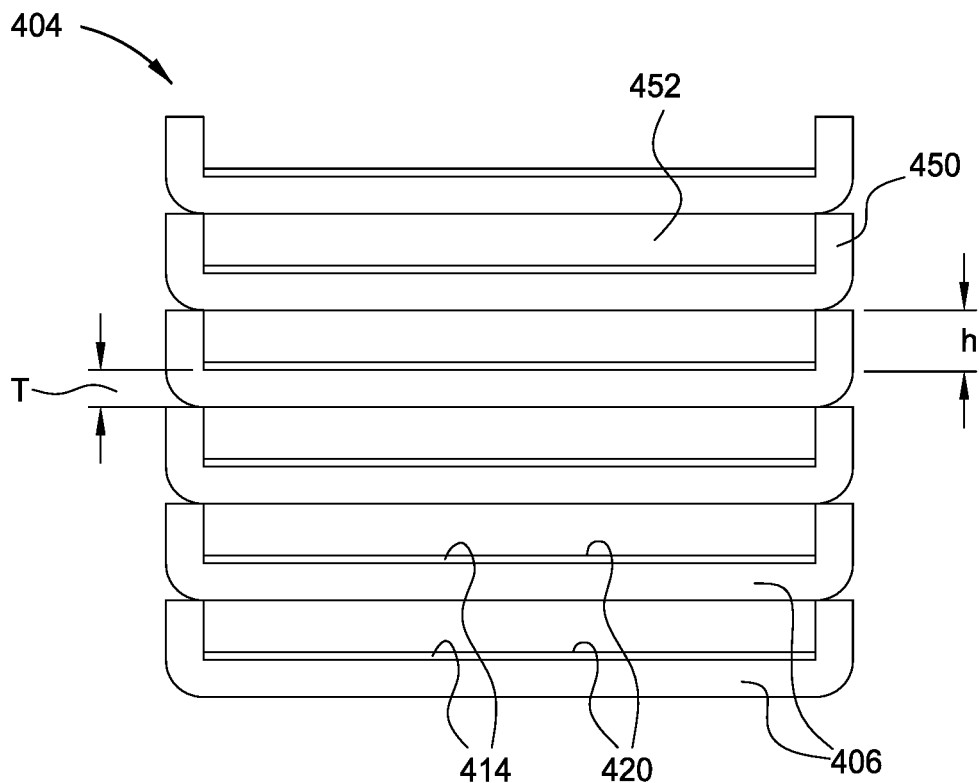
FIG. 4 is a schematic cross-sectional view of a heat sink that includes fins with airflow projections in accordance with one or more embodiments of the present disclosure.

Referring now to FIG. 4, a schematic cross-sectional view of a heat sink 404 in accordance with one or more embodiments of the present disclosure is shown. The heat sink 404 includes multiple fins 406, with each fin 406 including an airflow projection 420. FIG. 4 shows a perspective of the heat sink 404 with the stream of the cooling medium flowing into the page.

In FIG. 4, the fins 406 are assembled (e.g., zippered) to be in a horizontal orientation with respect to each other in this embodiment. The fins 406 each include one or more arms 450, such as by having arms 450 coupled to or formed at the edges of the fins 406. For example, the fins 406 may be folded at the edges to form the arms 450. The arms 450 extend in a direction orthogonal to the surface 414 such that the arms 450 engage an adjacent fin 406. The arms 450, thus, are used to define passages 452 between the fins 406 and through the heat sink 404 for the stream of the cooling medium. As discussed above, the fins 406 have a thickness T. Further, the passages 452 between the fins 406 have a height h. In one embodiment, the thickness T of the fins 406 may be between about 20% and about 40% the height h of the passages 452. In another embodiment, the thickness T of the fins 406 may be about 30% the height h of the passages 452.

Figure 5:
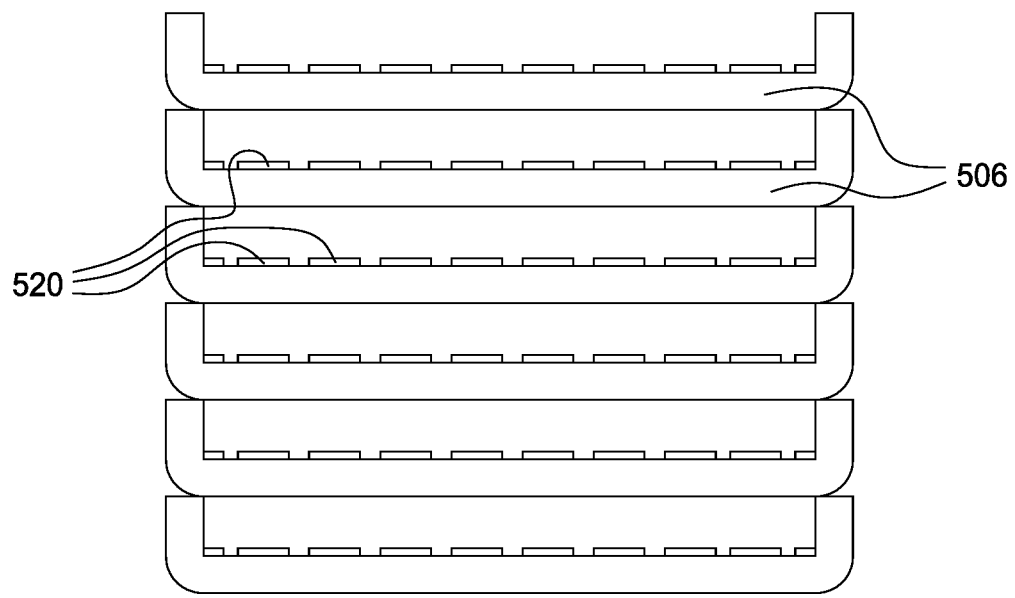
FIG. 5 is a schematic cross-sectional view of a heat sink that includes fins with airflow projections in accordance with one or more embodiments of the present disclosure.

As shown in FIG. 4, each fin 406 includes an airflow projection 420 coupled to the surface 414. The airflow projection 420 may extend substantially across the entire width of the fin 406. However, the present disclosure is not so limited. For example, with reference to FIG. 5, each fin 506 may include multiple airflow projections 520, in which each airflow projections 520 may extend across only a portion of the width of the fin 506. Further, the airflow projections 520 are arranged substantially perpendicular or orthogonal to the stream of the cooling medium with respect to each other. Accordingly, the width and the arrangement of the airflow projections on the surface of a fin may be varied without departing from the scope of the present disclosure.

Figure 6:
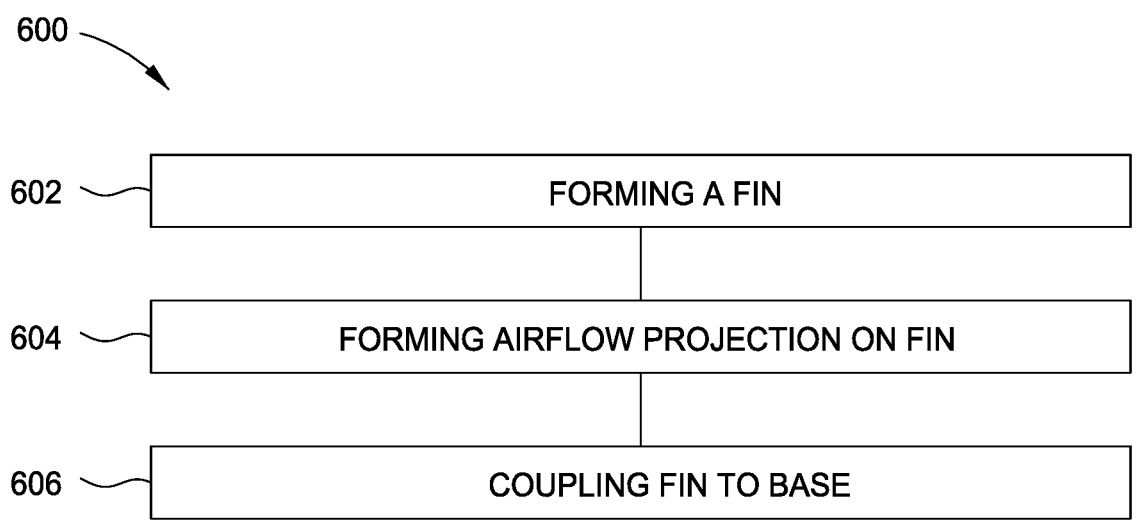
FIG. 6 is a flowchart of a method for manufacturing a heat transfer device in accordance with one or more embodiments of the present disclosure.

Referring now to FIG. 6, a method 600 of manufacturing a heat transfer device in accordance with one or more embodiments of the present disclosure is shown. The method 600 includes forming a fin that includes a surface to receive a cooling medium to travel across in operation 602. The fin may be cut, folded, or shaped, for example, from a sheet of metal. The method 600 further includes forming one or more airflow projections on the surface in operation 604. As discussed above, the airflow projection includes a downstream end cantilevered over the surface of the fin. Further, an additive manufacturing process may be used to form the airflow projection on the surface of the fin, such as by using three-dimensional printing, selective laser sintering, depositing, and/or soldering to form the airflow projection. The method 600 proceeds to coupling the fin to a base in operation 606. For example, if a heat pipe is included, the heat pipe may be coupled to the base, and the fin may be coupled to the heat pipe.

The use of directional terms such as above, below, upper, lower, upward, downward, left, right, horizontal, vertical, upstream, downstream, and the like are used in relation to the illustrative embodiments as depicted in the figures, the upward direction being toward the top of the corresponding figure and the downward direction being toward the bottom of the corresponding figure. Further, as used herein, the term "about" encompasses +/−5% of each numerical value. For example, if the numerical value is "about 80%," then it can be 80%+/−5%, equivalent to 76% to 84%. Accordingly, unless indicated to the contrary, the numerical parameters set forth in the following specification and attached claims are approximations that may vary depending upon the desired properties sought to be obtained by the exemplary embodiments described herein. At the very least, and not as an attempt to limit the application of the doctrine of equivalents to the scope of the claim, each numerical parameter should at least be construed in light of the number of reported significant digits and by applying ordinary rounding techniques.

While the foregoing is directed to embodiments of the present invention, other and further embodiments of the invention may be devised without departing from the basic scope thereof, and the scope thereof is determined by the claims that follow.

What is claimed is:

1. A heat transfer device, comprising:
    a base; and
    a heat sink coupled to the base, the heat sink comprising:
        a fin comprising a surface configured for receiving a cooling medium to travel across, thereby defining an upstream end and a downstream end for the fin; and
        an airflow projection coupled to the surface of the fin, the airflow projection comprising an upstream end and a downstream end, the downstream end of the airflow projection cantilevered above the surface of the fin, the airflow projection having:
        a lower surface coupled to the surface of the fin;
        an upper surface opposite the lower surface;
        the upstream end having a first upstream portion adjacent to the surface of the fin and a second upstream portion adjacent to the upper surface of the airflow projection, the first portion having a first positive slope in a downstream direction relative to the surface of the fin, and the second portion having a second positive slope relative to the surface of the fin, the second slope different than the first slope;
        the downstream end having a first downstream portion, a second downstream portion, and a third downstream portion, wherein:
        the first downstream portion is located adjacent the upper surface of the airflow projection and positioned at a negative slope in the downstream direction relative to the surface of the fin;
        the second downstream portion defines a tapered bottom surface on the downstream end defining a cavity between the tapered bottom surface and the fin, the second downstream portion having a positive slope in the downstream direction relative to the surface of the fin; and
        the third downstream portion is positioned between and adjoins the first downstream portion and the second downstream portion, the third downstream portion having a positive slope in the downstream direction relative to the surface of the fin.

2. The heat transfer device of claim 1, wherein the heat transfer device comprises a plurality of airflow projections coupled to the surface and arranged from the upstream end to the downstream end of the fin with respect to each other.

3. The heat transfer device of claim 1, wherein:
    the fin comprises a thickness and the airflow projection comprises a height; and
    the height of the airflow projection is between about 5% and about 20% the thickness of the fin.

4. The heat transfer device of claim 3, wherein the height of the airflow projection is about 10% the thickness of the fin.

5. The heat transfer device of claim 1, wherein:
    the fin comprises a thickness between about 0.1 mm and about 0.5 mm; and
    the airflow projection comprises a height between about 0.01 mm and about 0.05 mm.

6. The heat transfer device of claim 1, wherein the heat transfer device comprises a plurality of fins with an airflow projection corresponding to and coupled to a surface of each fin.

7. The heat transfer device of claim 6, further comprising a heat pipe positioned between the base and the heat sink to couple the plurality of fins to the base.

8. The heat transfer device of claim 6, wherein each fin further comprises an arm that extends in a direction orthogonal to the surface to engage an adjacent fin.

9. The heat transfer device of claim 1, wherein:
    the base comprises aluminum, copper, or steel;
    the fin comprises aluminum or copper; and
    the airflow projection comprises copper or nickel.

10. The heat transfer device of claim 1, wherein the fin and the airflow projection comprise different materials.

11. The heat transfer device of claim 1, wherein:
    the upstream end and the downstream end of the airflow projection each extend between the upper surface and the lower surface.

12. The heat transfer device of claim 1, wherein a second fin disposed on the fin, a lower surface of the second fin space apart from the airflow projection of the fin.

13. A heat sink, comprising:
    a fin comprising a surface configured for receiving a cooling medium to travel across, thereby defining an upstream end and a downstream end for the fin; and
    an airflow projection coupled to the surface of the fin, the airflow projection comprising an upstream end and a downstream end, the downstream end of the airflow projection cantilevered above the surface of the fin, the airflow projection having:
    a lower surface coupled to the surface of the fin;
    an upper surface opposite the lower surface:
    the upstream end having a first upstream portion adjacent to the surface of the fin and a second upstream portion adjacent to the upper surface of the airflow projection, the first portion having a first positive slope in a downstream direction relative to the surface of the fin, and the second portion having a second positive slope in the downstream direction relative to the surface of the fin, the second slope different than the first slope;
    the downstream end having a first downstream portion, a second downstream portion, and a third downstream portion, wherein:
    the first downstream portion is located adjacent the upper surface of the airflow projection and positioned at a negative slope in the downstream direction relative to the surface of the fin;
    the second downstream portion defines a tapered bottom surface on the downstream end defining a cavity between the tapered bottom surface and the fin, the second downstream portion having a positive slope in the downstream direction relative to the surface of the fin; and
    the third downstream portion is positioned between and adjoins the first downstream portion and the second downstream portion, the third downstream portion having a positive slope in the downstream direction relative to the surface of the fin.

14. The heat sink of claim 13, wherein the heat sink comprises a plurality of airflow projections coupled to the surface of the fin and arranged from the upstream end to the downstream end of the fin with respect to each other.

15. The heat sink of claim 13, wherein:
    the fin comprises a thickness and the airflow projection comprises a height; and the height of the airflow projection is between about 5% and about 20% the thickness of the fin.

16. A method of manufacturing a heat transfer device, comprising:

forming a fin comprising a surface configured for receiving a cooling medium to travel across;

forming an airflow projection on the surface of the fin, the airflow projection comprising an upstream end and a downstream end, the downstream end of the airflow projection cantilevered above the surface of the fin, the airflow projection having:

a lower surface coupled to the surface of the fin;

an upper surface opposite the lower surface;

the upstream end having a first upstream portion adjacent to the surface of the fin and a second upstream portion adjacent to the upper surface of the airflow projection, the first portion having a first positive slope in a downstream direction relative to the surface of the fin, and the second portion having a second positive slope in the downstream direction relative to the surface of the fin, the second slope different than the first slope;

the downstream end having a first downstream portion, a second downstream portion, and a third downstream portion, wherein:

the first downstream portion is located adjacent the upper surface of the airflow projection and positioned at a negative slope in the downstream direction relative to the surface of the fin;

the second downstream portion defines a tapered bottom surface on the downstream end defining a cavity between the tapered bottom surface and the fin, the second downstream portion having a positive slope in the downstream direction relative to the surface of the fin;

the third downstream portion is positioned between and adjoins the first downstream portion and the second downstream portion, the third downstream portion having a positive slope in the downstream direction relative to the surface of the fin; and coupling the fin to a base.

17. The method of claim 16, wherein:

forming the fin comprises forming a plurality of fins;

forming the airflow projection comprises forming a plurality of airflow projections on each fin; and coupling the fin comprises coupling each of the fins to the base.

18. The method of claim 16, wherein coupling the fin to the base comprises positioning the fin on a heat pipe with the heat pipe coupled to the base.

19. The method of claim 16, wherein forming the airflow projection on the surface comprises using an additive manufacturing process to form the airflow projection on the surface.

20. The method of claim 19, wherein the additive manufacturing process comprises selective laser sintering, depositing, or soldering.

* * * * *